United States Patent [19]

Shimozawa et al.

[11] Patent Number: 5,272,377
[45] Date of Patent: Dec. 21, 1993

[54] MALEIMIDE RESIN COMPOSITION AND RESIN ENCAPSULATED SEMICONDUCTOR DEVICE MANUFACTURED USING THE COMPOSITION

[75] Inventors: Hiroshi Shimozawa, Yokohama; Shinetsu Fujieda; Michiya Higashi, both of Kawasaki; Akira Yoshizumi, Yokohama, all of Japan

[73] Assignee: Kabushiki Kaisha Toshiba, Kawasaki, Japan

[21] Appl. No.: 785,812

[22] Filed: Oct. 31, 1991

[30] Foreign Application Priority Data

Oct. 31, 1990 [JP] Japan ................................ 2-293910
Oct. 9, 1991 [JP] Japan ................................ 3-262204

[51] Int. Cl.$^5$ ................................ H01L 23/28
[52] U.S. Cl. ................................ 257/787; 257/788; 257/795
[58] Field of Search ............ 257/787, 788, 759, 793, 257/795; 526/279, 313; 525/100, 502

[56] References Cited

U.S. PATENT DOCUMENTS 4,131,632 12/1978 Suzuki et al. ................ 526/313
5,070,154 12/1991 Shiobara et al. ............... 525/502

FOREIGN PATENT DOCUMENTS 61-233017 10/1986 Japan.
62-127316 6/1987 Japan.
62-169825 7/1987 Japan.

OTHER PUBLICATIONS

Database WPIL, AN 87-132566, JP-A-62 072 722, Apr. 3, 1987.
Patent Abstracts of Japan, vol. 12, No. 472 (C-551), Dec. 9, 1988, JP-A-63 191 833, Aug. 9, 1988.
Database WPIL, AN 90-251082, JP-A-2 175709, Jul. 9, 1990.
Database WPIL, AN 89-343294, JP-A-1 254 735, Oct. 11, 1989.
Database WPIL, AN 89-289808, JP-A-1 213 336, Aug. 28, 1989.
Patent Abstracts of Japan, vol. 13, No. 523 (C-657), Nov. 21, 1989, JP-A-1 213 335, Aug. 28, 1989.
Database WPIL, AN 87-112125, JP-A-62 057 420, Mar. 13, 1987.

Primary Examiner—William Mintel
Assistant Examiner—Roy Potter
Attorney, Agent, or Firm—Oblon, Spivak, McClelland, Maier & Neustadt

[57] ABSTRACT

The device characteristics is in containing a maleimide resin with a content of 0.2 weight percent of less of an organic acid, a phenolic resin, and a combination of a basic catalyst and a peroxide as a curing catalyst. In addition, additives as a mold release agent such as a polyethylene wax and an inorganic filler are contained. The maleimide resin composition is prepared in such a manner that a part of the phenolic resin is preblended with the curing catalyst in advance of other components, while the remainder of the phenolic resin is added to the maleimide resin to prepolymerize, and then, the preblend and the prepolyer are blended the other components. The maleimide resin composition has excellent moldability by improvement of curing characteristics through combined use of a basic catalyst and a peroxide as a curing agent. Besides, a resin encapsulated semiconductor device manufactured by encapsulating a semiconductor element with the resin composition has excellent heat resistance and moisture-resistance reliability.

12 Claims, 1 Drawing Sheet

FIG. 1

MALEIMIDE RESIN COMPOSITION AND RESIN ENCAPSULATED SEMICONDUCTOR DEVICE MANUFACTURED USING THE COMPOSITION

BACKGROUND OF THE INVENTION

1. Field of the Invention

This invention relates to a maleimide resin composition suitably allowing encapsulation of a semiconductor element and to a resin encapsulated semiconductor device manufactured using the composition.

2. Description of the Related Art

Recently, rapid increase is progressing in fining various function units of a semiconductor element and in size of the element. An epoxy resin composition containing a thermosetting epoxy resin as a resin component and a phenolic resin as a curing agent is widely used for resin encapulation of the semiconductor element.

A flat package-type IC, for example, a gate array called ASIC (Application specific IC) and a standard cell-type LSI, encapuslated with the resin composition described above is mounted on a substrate by processes of vapor phase re-flow, infrared re-flow, and soaking in solder. In these process, the package is exposed to high temperature (ca. 215°–260° C.). Then, in the resin encapsulated semiconductor encapsulated with said epoxy resin composition, very small amount of water permeated through resin to inside abruptly evaporates allowing to crack the encapsulating resin. Crack developed to outside spoils moisture-resistance reliability of the resin encapsulated semiconductor to make a great problem. Besides, a phenomenon occurs to disturb to mount the package due to swelling of the encapsulated resin.

Inside the semiconductor element encapsulated with the resin composition in the processes described above, the following problems frequently occurs: crack occurred in PSG (phoshor silicate glass) and SiN (silicon nitride) used as a passivation film formed on a wiring layer of aluminum; cutting of Au bonding wires.

For measures for these problems, the following requirements have increased intensively for the encapsulating resin used for manufacturing a large package.

1) To decrease stress against an object encapsulated with the encapsulating resin and to increase adhesion of encapsulating resin to PSG, SiN, polyimde film, and lead frame.
2) To give high-temperature strength corresponding to mounting temperature and high-temperature strength with moisture absorbance to the encapsulating resin and to reduce moisture absorbance.

On the basis of the above views, utilizing for main resin components of the encapsulating resin composition is being evaluated for such as maleimide resins, PPS (polyphenylene sulfide) resin, PPO (polyphenylene oxide) resin, and a liquid crystal polymer. Recent candidates of the encapsulating resin proposed are combined resins of maleimide and epoxy resins or amino-bis-maleimide resin made by combining bis-maleimide resin and 4,4'-diaminodiphenylmethane. Generally, encapsulation of a semiconductor element using these maleimide resins is made by molding a resin composition containing a maleimide resin as a main component of resin, a phenolic resin as a curing agent component, a curing catalyst, and other additives such as an inorganic filler and a flame-retardant, employing normal molding process, such as transfer molding. It is said that the additional reaction of the phenolic resin to double bonds of the maleimide resin contained in the resin composition and the mutual reaction of maleimide resins occur in the molding process to cure the composition by polymerization of the maleimide resin resulting in the yield of the encapusulating resin moldings.

The following problems occur at resin encapsulation of a semiconductor element using the maleimide resin composition described above. In comparison with the epoxy resin composition containing a phenolic resin as a curing agent, the maleimide resin composition shows less curing characteristics, because the reaction between the maleimide resin and the phenolic resin slowly progresses in said maleimide resin composition. Hence, molding resin for encapsulating requires long time to result in remaining non-reacted components and in decrease in mold release characteristics from a mold used.

In addition, monomer and low molecular substance remain in the resin composition to make stain on the mold. The encapsulating resin moldings results in problems such as inferior appearance.

Consequently, though use of the maleimide resin composition for resin encapsulation of a semiconductor element solves problems in the use of the conventional epoxy resin composition, the use causes a problem of very inferior properties such as moldability.

SUMMARY OF THE INVENTION

An object of the present invention is to improve such as curing characteristics of a maleimide resin composition used for encapsulation of a semiconductor element. To be more specific, the present invention is intended to provide a maleimide resin composition showing better moldability to yield short time molding, less stain of a mold at molding, good releasing from a mold and, good external appearance of moldings.

Another object of the present invention is to provide highly reliable resin encapsulated semiconductor device having resin encapsulation with the maleimide resin composition showing better moldability as described above.

The object is achieved according the present invention by a maleimide resin composition comprising as essential components, a maleimide resin, a phenolic resin, and a curing catalyst, wherein the curing catalyst is a combination of a basic catalyst and a peroxide.

Still further, the present invention provides a resin encapsulated semiconductor device manufactured by encapusulating a semiconductor element with a maleimide resin composition comprising a maleimide resin, a phenolic resin, a curing catalyst, i.e. a combination of a basic catalyst and a peroxide.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates a presently preferred embodiment of the invention and, together with the general description given above and the detailed description of the preferred embodiment given below, serves to explain the principles of the invention.

DETAILED DESCRIPTION OF THE PREFERRED EMBODIMENTS

The followings are the detailed explanation of the present invention.

It is said that in the maleimide resin composition of the present invention, the additional reaction of the phenolic resin being a curing agent component to double bonds of the maleimide resin being a main component of resin and the mutual reaction of the maleimide resin occur place through the function of the curing catalyst, and the resin composition is cured by progress of polymerization of the maleimide resin to form a cured product.

Though the maleimide resin is not particularly restricted in the present invention, for example, a N,N'-substituted bismaleimide compound represented by general formula (1) given below or poly(phenylene methylene)polymaleimide represented by general formula (2) given below can be used.

(1)

where, X represents a divalent hydrocarbon group such as an alkylene group, a cyclo-alkylene group, and a monocyclic or polycyclic arylene group, or a divalent hydrocarbon group combined by a divalent atomic group such as —CH$_2$—, —CO—, —SO$_2$—, and —CONH—.)

(2)

where, m represents an integral of 1 to 5.

To be more specific, the maleimide resin used in the present invention includes, for example, N,N'-phenylenebismaleimide, N,N'-hexamethylenebismaleimide, N,N'-diphenylmethanebismaleimide, N,N'-oxydi-p-phenylenebismaleimide, N,N'-4,4'-benzophenonebismaleimide, N,N'-p-diphenylsulfonebismaleimide, N,N'-(3,3'dimethyl)methylene-di-p-phenylenebismaleimide, poly(phenylmethylene)polymaleimide, 2,2'-bis(4-phenoxyphenyl)propane-N,N'-bismaleimide, bis(4-phenoxyphenyl)sulfone-N,N'-bismaleimide, 1,4-bis(4-phenoxy)benzene-N,N'-bismaleimide, 1,3-bis(4-phenoxy)benzene-N,N'-bismaleimide, 1,3-bis-(3-phenoxy)benzene-N,N'-bismaleimide. These maleimide resins can be used singly or in combination.

The maleimide resin can contain a trace amount of an organic acid. The organic acid is those remained in the resin when purification of the maleimide resin is not enough; examples are acetic acid, maleic acid, fumaric acid, and fatty acids. These organic acids can be extracted from the resin by hot water treatment of the maleimide resin under the condition of 95° C. for 20 hours or more and can be analyzed by an ion chromatography and a liquid chromatography. In the maleimide resin composition of the present invention, an organic acid content in the maleimide resin has a great influence on the properties of a cured product finally molded. Namely, a large amount of an organic acid left by insufficient purification of the maleimide resin reduces moisture-resistance of the cured product. Corrosion of a Al wiring layer on a semiconductor chip progresses in the case of encapsulation of a semiconductor element with the resin composition containing the maleimide resin having a large amount of an organic acid. Consequently, organic acid content in the maleimide resin should be not more than 0.2 weight percent or preferably not more than 0.1 weight percent in values determined by the extracting and analyzing methods described above.

A synthesizing method of the maleimide resin such as a bismaleimide resin is exemplified by a method in which purification is performed for a bismaleimide resin obtained by dehydrating and cyclizing a bismaleamic acid, which is synthesized in a reaction solvent in advance, with acetic anhydride. Another method is that purification is performed for a bismaleimide resin obtained by direct dehydration and cyclization of a bismaleamic acid by heating without acetic anhydride in a reaction solvent. Although the manufacturing method of the maleimide resin is not restricted to these methods, as mentioned before, the latter method is preferable to reduce an amount of an organic acid remained in the maleimide resin as possible.

As the phenolic resin as a curing agent component in the maleimide resin composition of the present invention, novolak type phenolic resin, for example, is used. Any novolak type phenolic resin having two or more phenolic hydroxyl groups in a single molecule can be used. The specific novalak resin used in the present invention includes, for example, phenolic novolak resin, cresol novolak resin, t-butyl phenolic novolak resin, nonyl phenolic novolak resin, phenolic aralkyl resin, dicyclopentadien phenolic novolak resin are used. Particularly, phenolic resins having a group reactive to a maleimide resin, such as amino group, allyl group, vinyl group, and acryl group, can be used. Among these phenolic resins, phenolic novolak resin is particularly preferable in terms of moldability and strength.

To be more specific, the phenolic resin includes, for example, the following novolak type phenolic resins marketed: Shonol BRG-555 (Showa High Polymer Co., Ltd., softening point 68° C., melting viscosity 2.4 ps at 125° C.), Shonol BRG-556 (Showa High Polymer Co., Ltd., softening point 80° C., melting viscosity 1.8 ps at 150° C.), Shonol BRG-557 (Showa High Polymer Co., Ltd., softening point 87° C., melting viscosity 3.0 ps at 150° C.), Shonol BRG-558 (Showa High Polymer Co., Ltd., softening point 97° C., melting viscosity 6.2 ps at 150° C.), Varcum TD-2131 (Dai Nippon Ink, kk, softening point 80° C., melting viscosity 3.3 ps at 150° C.), and Varcum TD-2093 (Dai Nippon Ink, kk, softening point 100° C., melting viscosity 30 ps at 150° C.).

As the phenolic resin contained in the maleimide resin composition of the present invention, allyl phenolic resin represented by general formulae (3), (4), or (5) given below can be also used.

where, R represents —CH$_2$—CH=CH$_2$; n and l are positive integers.

When an allyl phenolic resin is contained in the maleimide resin compound of the present invention, a content of an allyl phenol monomer contained in the allyl phenolic resin is preferably 1000 ppm and less to reduce volatiled components at melting. Preferable examples of allyl phenol monomers allowing to use in the present invention are SH-140A (Mitsubishi Petrochemical Co., Ltd.), SH-150A (Mitsubishi petrochemical Co., Ltd.), and XPSF-4488 (Gunei Chemical Industry Co., Ltd.).

It is preferred that a content of the phenolic resin in the maleimide resin composition of the present invention is 10 to 50 weight percent based the maleimide resin content. The content of the phenolic resin below 10 weight percent increase melting viscosity of the maleimide resin composition to result in unloading and wire flow at molding. On the other hand, the content of the phenolic resin over 50 weight percent makes curing characteristics of the resin composition unsatisfactory and allows to reduce heat resistance of a cured product finally molded. Besides, a more preferable content of the phenolic resin is 20-40 weight percent based on the maleimide resin content.

In the maleimide resin composition of the present invention, a birary catalyst including a basic catalyst and a peroxide is used as a curing catalyst.

As the basic catalyst, for example, organic phosphine compounds, imidazole compounds or their derivatives, and DBU (1,8-diazabicyclo (5,4,0)undecene-7) or its phenolic salt are used. These compounds can be used singly or in comination as the need arises.

The specific organic phosphines include, for example, trimethylphosphine, triethylphosphine, tributylphosphine, triphenylphosphine, tri(p-methylphenyl)phosphine, tri(nonylphenyl)phosphine, methyldiphenylphosphine, butylphenylphosphine, tricyclohexylphosphine, 1,2-bis(diphenylphosphine)ethane, and bis(diphenylphosphine)methane. These organic phosphine compounds can be used singly or in combination.

The specific imidazole compounds include, for example, 2-methylimidazole, 2,4-dimethylimidazole, 2-ethyl-4-methylimidazole, 2-phenylimidazole, 2-phenyl-4-methylimidazole, and 2-heptadecylimidazole.

The phenolic salt of DBU is exemplified by SA-853 (Sanapuro).

The specific peroxide used in the present invention includes, for example, dialkyl peroxides such as di-t-butyl peroxide, dicumyl peroxide, t-butylcumyl peroxide, 2,5-dimethyl-2,5-di-t-butyl peroxyhexane; peroxy esters such as t-butyl peroxy acetate, t-butyl peroxy phthalate, t-butyl peroxy benzoate, 2,5-dimethyl-2,5-dibenzoyl peroxyhexane, and t-butyl peroxy-2-ethyl hexanoate; diacyl peroxides such as acetyl peroxide, isobutyryl peroxide, decanoyl peroxide, lauroyl peroxide, 3,5,5-trimethylhexanoyl peroxide, benzoyl peroxide, and di-2-ethylhexyl peroxy dicarbonate; hydroperoxides such as t-butyl hydroperoxide, cumene hydroperoxide, and p-methane hydroperoxide; ketone peroxides such as methylethyl ketone peroxide and cyclohexanone peroxide; peroxy ketals such as 1,1-bis(t-butyl peroxy)cyclohexane and 1,1-bis(t-butyl peroxy)-3,3,5-trimethyl cyclohexane. These peroxides can be used singly or in combination.

In the maleimide resin composition of the present invention, the total content of the curing catalyst is preferably 0.1 to 10 weight percent based on the total content of the maleimide resin (main component of resin) and the phenolic resin (curing agent component). The content of the curing catalyst below 0.1 weight percent makes reaction of the maleimide resin to the phenolic resin insufficient to result in insufficiency of curing. Hence electric characteristics of a cured product finally molded, i.e. an encapsulating resin molded, is very lowered. On the other hand, the content of the curing catalyst over 10% allows to reduce heat resistance, moisture-resistance, and electric characteristics of a cured product finally molded. More preferable content of the curing catalyst is 0.5 to 5 weight percent based on the total content of the maleimide resin and the phenolic resin.

The content ratio of the basic catalyst and the peroxide in the curing catalyst should be preferably made by arranging content of the peroxide to be 10 to 50 weight percent based on the content of the basic catalyst. The content of the peroxide below 10 weight percent makes promotion of polymerizing reaction of maleimide resin (bismaleimide) insufficient to result in lowering moldability of the resin composition and to inhibit to improve performances such as heat resistance, of a cured product. On the other hand, the content of peroxides over 50% allows to lower considerably moisture-resistance and electric characteristics of a cured product. In addition, in order to make combined use of the basic catalyst and the peroxide most effective and to realize excellent performances of the maleimide resin composition such as curing characteristics, moldability, and heat resistance, moisture resistance, and electric characteristics of a cured product yielded, the content of the peroxide should be preferably 20 to 30 weight percent based on the content of the basic catalyst.

The maleimide resin composition of the present invention particularly used for encapsulating a semiconductor element usually contains an inorganic filler in addition to essential components described above.

As the inorganic filler, for example, quartz glass powder, crystalline silica powder, glass fiber, talc, alumina powder, calcium silicate powder, calcium carbonate powder, barium sulfate powder, and magnesia powder, can be used. Among these fillers, the most preferables are quartz power and crystalline silica powder. The content of the silica powder can be in the range of 50 to 85 weight percent based on the content of the maleimide resin composition with proper combination of ground silica, globular silica, and fumed silica. The content of the inorganic filler below 50 weight percent increases thermal coefficient of expansion of a cured product finally obtained to result in insufficient thermal inpulse resistance. On the other hand, the content of the inorganic filler over 85 weight percent makes fluidity of the maleimide resin composition insufficient to result in wire flow, bed flow and unloading.

In the maleimide resin composition of the present invention, various waxes can be added as a mold release agent to increase its moldability. The waxes for the use are exemplified by polyethylene series waxes, i.e. waxy materials containing a main component of polyethylene with a molecular weight of 500 to 4000. The polyethylene series waxes can be those generally called a polyethylene wax. In addition, other candidates are those having a carboxyl group as a polar group introduced by oxidizing denaturation or denaturation with acid. In the present invention, particularly, polyethylene series waxes having a softening point of 65° to 140° C. are preferable. The content of the wax contained in the maleimide resin composition of the present invention should be 0.2 to 19 parts by weight, preferably 0.5 to 5 parts by weight, based on 100 parts by weight of the resin composition. The wax content less than 0.2 parts by weight allows to lower release property of a cured product from a mold. On the other hand, the content over 19 parts by weight allows to stain a mold by largely bleeding wax contained in the resin composition. For reference, in the maleimide resin composition of the present invention, ester series waxes such as carunauba wax and fatty acid amide series waxes can be added and a combination use of these waxes and polyethylene series waxes can be allowed.

Organosyloxane bismaleimide can be added to the maleimide resin composition of the present invention in order to improve adhesion of a cured product finally molded to a polyimide protecting film and to a insulating film such as $SiO_2$ and SiN formed on the surface of a semiconductor element. Besides, additives containing silicon rubber or silicon gel as a main component or MBS or ABS as a main component can be added in order to give low stress to a cured product finally molded.

As another component, a flame-retardant such as a epoxy halide resin and antimony trioxide, a colorant such as carbon powder, or a coupling agent can be added as the need arises.

The followings are the detailed explanation of preparation of the maleimide resin composition of the present invention.

In preparing the maleimide resin composition of the present invention, it is generally preferably that a part of whole of the phenolic resin being a component of a curing agent is preblended with the curing catalyst containing a basic catalyst and a peroxide in advance of other components, in order to improve moldability of the resin composition. Specifically, first, prior to blending other components, a part of whole of the phenolic resin being the component of the curing agent and a part or whole of the curing catalyst are dissolved and blended (preblending) to yield them in uniform and clear state. Subsequently, this blend is cooled and powdered by grinding to obtain a phenolic resin containing the curing catalyst. After this process, melting and kneading are performed for this phenolic resin containing the curing catalyst, the maleimide resin, the remainder of the phenolic resin, the remainder of the curing catalyst (when a part of the phenolic resin and a part of the curing catalyst are preblended), and as the need arises, other components such as an inorganic filler and additives, followed by grinding powdering, finally to obtain the maleimide resin composition of the present invention.

In the process described above, the curing catalyst preblended, both or either of the basic catalyst and the peroxide can be used. However, it is more preferable that both kinds of the basic catalyst and the peroxide are preblended with the phenolic resin in order to improve dispersability the of curing catalyst in the resin composition.

The temperature at which preblending is performed should be softening point of the phenolic resin used or higher. The temperature should be preferably in the range keeping catalytic activity by thermal decomposition of the peroxide contained in the curing catalyst.

In the preblending, when a part of the phenolic resin used and the curing catalyst are blended, the remainder of the phenolic resin prepolymerized by adding it to maleimide resin as a main component of resin can be used for the preparation of the maleimide resin composition. On this occasion, an amount of the phenolic resin preblended with the curing catalyst should be preferably 1 to 50 weight percent based on the whole amount of the phenolic resin used for the preparation of the maleimide resin composition. When the amount of the phenolic resin preblended is less than 1 weight percent based on the whole amount of the phenolic resin used for preparing the maleimide resin composition, dispersion of the curing catalyst in the preblending is insufficient to result in less effect of that. On the other hand, the amount of the phenolic resin excessive to 50 weight percent based on the whole amount of the phenolic resin used for preparing the maleimide resin composition makes the amount of the remainder of the phenolic resin for the pre-polymerization with the maleimide resin less to result in decrease in operational performance of the pre-polymerization. The particularly preferable amount of the phenolic resin used for preblending is 3 to 40 weight percent based on the whole amount of the phenolic resin amount used for the preparation of the maleimide resin composition.

Preferably in the maleimide resin composition of the present invention, the combined operation of the preblending a part of said phenolic resin with the curing catalyst and the pre-polymerizing the remainder of the phenolic resin with the maleimide resin improves dispersibility of the curing catalyst to result in improvement of curing characteristics of the maleimide resin composition. In the preparation of the maleimide resin composition of the present invention, there are the following possible methods for preblending a part or whole of the phenolic resin with the curing catalyst and for melting and kneading of remaining components: melting and kenading using a heated roll; melting and kneading using a kneader; melting and keneading using an extruder; blending using a special blender after grinding; a proper combination of these methods.

The resin encapsulated semiconductor device of the present invention was manufactured by encapsulating a semiconductor element with the maleimide resin composition described previously, which contains an inorganic filler, according to a normal method.

Figure 1:
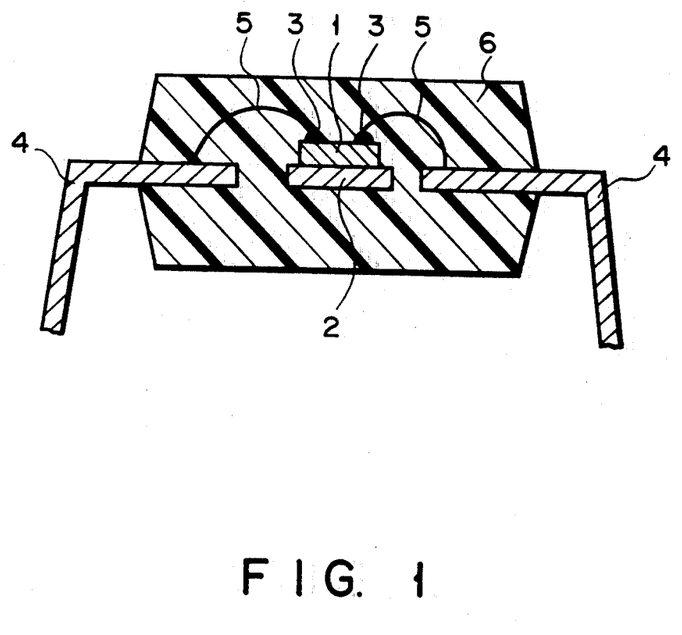
FIG. 1 shows a sectional view showing structure of a resin encapsulated semiconductor device according to the present invention.

FIG. 1 shows a sectional structure of an example of a resin encapsulated semiconductor device of the invention. In the figure, 1 shows a semiconductor chip mounted on an island 2. On the surface of the semiconductor chip 1, plural bonding pads 3 are formed and these and a lead frame 4 of an outer terminal are connected each other using a bonding wire 5. The individual device composed of a semiconductor element and parts such as a lead frame is encapsulated as covered with an encapsulating resin 6. As the encapsulating resin 6 in the present invention, the resin composition containing the maleimide resin, the phenolic resin, the combination of the basic catalyst and the peroxide as a curing catalyst, and the inorganic filler described previously is used. Although the most common method of this type of resin encapsulation is low pressure transfer molding, resin encapsulation by injection molding, compression molding, and casting is possible to employ. On this occasion, after-curing at 175° C. or higher is preferred after the molding.

The maleimide resin composition of the present invention can be applied to a thermoresistance plywood, and a thermoresistance adhesive and a thermoresistance paint, which are obtained by adding a diluting solvent to the composition, as well as use for the resin encapsulation of a semiconductor element.

The maleimide resin composition of the invention has a characteristic of combined use of the basic catalyst and the peroxide as the curing catalyst. Between them, the peroxide has a function of a radical polymerization intiator, which reacts to double bonds of the maleimide resin so as to promote polymerization among molecules of the resin. On the other hand, the basic catalyst primarily promotes additional reaction of the phenolic resin being a curing agent to the maleimide resin. On the contrary, sole use of the basic catalyst as the curing catalyst leaves unreacted double bonds in the maleimide resin to result in insufficient progress of its polymerization. Sole use of the peroxide as the curing catalyst inhibits enough progress of reaction between the phenolic resin and the maleimide resin.

In the maleimide resin composition of the present invention, both reactions of the mutual polymerization of the maleimide resin and the additional reaction of the phenolic resin to the maleimide resin are promoted to improve its curing characteristics. Consequently improvements are achieved for moldability of the resin composition such as shortening of molding time, reducing stain of a mold, and improvement of mold release characteristics of a cured product from a mold to result in obtaining an encapsulating resin mold having good external appearance. A cured product has properties of heat resistance, moisture-resistance reliability, and electric characteristics appropriate for an encapsulating resin.

In the preparation process of the maleimide resin composition of the present invention, preblending a part or whole of the phenolic resin being a curing agent with the curing catalyst, prior to blending with other components, allows to make improvement of dispersability of the curing catalyst in the resin composition. Thus, when resin encapsulation of a semiconductor element with the maleimide resin composition is performed, progress of the additional reaction of the phenolic resin to the maleimide resin and the mutual reaction of the maleimide resin is promoted to make curing characteristics of the resin composition better. Therefore, improvement is also realized for moldability of the resin composition and for various performances of a cured product obtained, as well as those mentioned above.

In the maleimide resin composition of the present invention, its curing characteristics is further improved by preparing the maleimide resin composition in such a manner that a part of the phenolic resin is preblended with the curing catalyst in advance of other components, while the remainder of the phenolic resin is added to the maleimide resin to prepolymerize, and then, the preblend is blended with the other components.

Besides, on the basis of the characteristics of maleimide resin, high reliability in performances such as heat resistance and moisture-resistance is applied to the resin encapsulated semiconductor device, as mentioned above, manufactured using the maleimide resin composition of the present invention as encapsulating resin.

The followings are detailed explanations of the invention on the basis of Examples and Comparative Examples.

Content ratios of components used in the following Examples and Comparative Examples are all expressed in weight percent.

First, 100 g of a novolak type phenolic resin, Shonol BRG-556 (available from Showa High Polymer Co., Ltd., softening point 80° C.) was charged in a separable flask and was melted at 120° C. followed by dissolving a curing catalyst of the (a) to (f) described below into the melted mixture. Thus, preblending of the phenolic resin with the curing catalyst were performed.

(a) 25 g of triphenyl phosphine (used for the Examples 1 and 4, and Comparative Examples 5 and 6);
(b) 6 g of dicumyl peroxide (used for Examples 2 and 5);
(c) 25 g of triphenyl phosphine, and 6 g of dicumyl peroxide, (used for Examples 3 and 6 to 8);
(d) 40 g of 2-methylimidazole, and 6 g of dicumyl peroxide, (used for Examples 9);
(e) 30 g of 1,8-diazabicyclo (5,4,0) undecene-7, and 6 g of dicumyl peroxide (used for Example 10);
(f) 25 g Of dimethylphenyl phosphine, and 6 g of dicumyl peroxide (used for Example 11).

Subsequently, clarity and uniformity of each of these blends was confirmed and the blend was poured into a stainless vat to cool and grind. Finally, six kinds of phenolic resins containing curing catalyst are obtained.

Next, according to the following method, the maleimide resin compositions of Examples 1 to 11 and Comparative Examples 1 to 7 were prepared with components in content ratios showed in the following Table 1

(Examples 1 to 11) and Table 2 (Comparative Examples 1 to 7).

Specifically, first, pre-polymerization was performed by blending a phenolic resin, which had not been preblended with the curing catalyst, with the maleimide resin. Besides, melted silica powder GR-80T (available from Toshiba Ceramics Co., Ltd.) as an inorganic filler was treated using epoxy silane coupling agent A-187 (available from Nihon Unicar Co., Ltd.) in a Henschel mixer. Next, all components containing these are put in the mixer to treat for five minutes and kneaded with a roll heated 110° C. Following to this process, the kneaded mixture was cooled, grirded, and made in tablets to obtain maleimide composition of each Examples 1 to 11 and Comparative Examples 1 to 7.

In the maleimide resin composition of Examples 1 to 11, a basic catalyst and a peroxide are added as a curing catalyst. Here, Examples 1 and 4 employed the phenolic resin containing curing catalyst made by preblending the curing catalyst of (a), Examples 2 and 5 employed the phenolic resin containing curing catalyst made by preblending the curing catalyst of (b), Examples 3 and 6 to 8 employed the phenolic resin containing curing catalyst made by preblending the curing catalyst of (c), Example 9 employed the phenolic resin containing curing catalyst made by preblending the curing catalyst of (d), Example 10 employed the phenolic resin containing curing catalyst made by preblending the curing catalyst of (e), Example 11 employed the phenolic resin containing curing catalyst made by preblending the curing catalyst of (f).

On the other hand, in the maleimide resin composition of Comparative Examples 1 to 7, either a basic catalyst or a peroxide is added as a curing catalyst. In Comparative Examples 1 to 4 and 7, no preblending was performed for a curing catalyst and a phenolic resin; Comparative Examples 5 and 6 were preblended.

The content of an organic acid in the maleimide resin used for the resin composition was measured according to the method described previously. The values of them are showed in Table 1 and 2.

TABLE 1

| Value in weight % | Example | | | | | | | | | | |
|---|---|---|---|---|---|---|---|---|---|---|---|
| | 1 | 2 | 3 | 4 | 5 | 6 | 7 | 8 | 9 | 10 | 11 |
| Novolak type phenolic resin Shonol BRG-556 (Showa High Polymer Co., Ltd. made) | 6.5 | 6.5 | 6.5 | 6.5 | 6.5 | 6.5 | 6.5 | 6.5 | 6.45 | 6.45 | 6.4 |
| Phenolic resin containing curing catalyst * | 1.25 | 1.06 | 1.31 | 1.25 | 1.06 | 1.31 | 1.31 | 1.31 | 1.46 | 1.36 | 1.41 |
| Kind of curing catalyst in * | (a) | (b) | (c) | (a) | (b) | (c) | (c) | (c) | (d) | (e) | (f) |
| Triphenylphosphine | — | 0.25 | — | — | 0.25 | — | — | — | — | — | — |
| Dicumyl peroxide | 0.06 | — | — | 0.06 | — | — | — | — | — | — | — |
| N,N'-diphenylmethane bismaleimide (M.W. 388) | 17.5 | 17.5 | 17.5 | — | — | — | 17.5 | — | 17.4 | 17.5 | 17.5 |
| N,N'-bis(4-phenoxyphenyl) propnae-N,N'-bismaleimide (M.W. 600.5) | — | — | — | 17.5 | 17.5 | 17.5 | — | 17.5 | — | — | — |
| Epoxy resin bromide BREN-S (Nippon Kayaku Co., Ltd. made) | 2.29 | 2.29 | 2.29 | 2.29 | 2.29 | 2.29 | 2.29 | 2.29 | 2.29 | 2.29 | 2.29 |
| Polyethylene was HW-4252E (Mitsui Petrochemical Industries Co., Ltd. made) | — | — | — | — | — | — | 0.60 | 0.60 | 0.60 | 0.60 | 0.60 |
| Carunauba wax | 0.6 | 0.6 | 0.6 | 0.6 | 0.6 | 0.6 | — | — | — | — | — |
| Melted silica powder GR-80T (Toshiba Ceramics Co., Ltd. made) | 71.0 | 71.0 | 71.0 | 71.0 | 71.0 | 71.0 | 71.0 | 71.0 | 71.0 | 71.0 | 71.0 |
| Epoxy silane coupling agent A-187 (Nihon Unicar Co., Ltd. made) | 0.40 | 0.40 | 0.40 | 0.40 | 0.40 | 0.40 | 0.40 | 0.40 | 0.40 | 0.40 | 0.40 |
| Carbon powder | 0.40 | 0.40 | 0.40 | 0.40 | 0.40 | 0.40 | 0.40 | 0.40 | 0.40 | 0.40 | 0.40 |
| Organic acid content in maleimide resin** | 0.12 | 0.12 | 0.12 | 0.12 | 0.12 | 0.12 | 0.12 | 0.12 | 0.12 | 0.12 | 0.12 |

**Weight % in maleimide resin (Measured after extraction from maleimide resin employing hot water treatment under the condition of 95° C. for 20 hours or longer.)

the phenolic resin containing curing catalyst made by

TABLE 2

| Value in weight % | Comparative Example | | | | | | |
|---|---|---|---|---|---|---|---|
| | 1 | 2 | 3 | 4 | 5 | 6 | 7 |
| Novolak type phenolic resin Shonol BRG-556 (Showa High Polymer Co., Ltd. made) | 7.52 | 7.53 | 7.46 | 7.52 | 6.52 | 6.53 | 7.46 |
| Phenolic resin containing curing catalyst * | — | — | — | — | 1.25 | 1.23 | — |
| Kind of curing catalyst in * | — | — | — | — | (a) | (b) | — |
| Triphenylphosphine | 0.25 | — | 0.25 | 0.25 | — | — | 0.25 |
| Dicumyl peroxide | — | 0.23 | — | — | — | — | — |
| N'N'-diphenylmethane bismaleimide (M.W. 388) | 17.54 | 17.55 | 17.40 | 17.54 | 17.54 | 17.55 | 17.40 |
| N,N'-bis(4-phenoxyphenyl) propane-N,N'-bismaleimide (M.W. 600.5) | — | — | — | — | — | — | — |

TABLE 2-continued

| Value in weight % | Comparative Example | | | | | | |
|---|---|---|---|---|---|---|---|
| | 1 | 2 | 3 | 4 | 5 | 6 | 7 |
| Epoxy resin bromide BREN-S (nippon Kayaku Co., Ltd. made) | 2.29 | 2.29 | 2.29 | 2.29 | 2.29 | 2.29 | 2.29 |
| Polyethylene was HW-4252E (Mitsui Petrochemical Industries Co., Ltd. made) | 0.60 | 0.60 | — | 0.60 | 0.60 | 0.60 | — |
| Carunauba wax | — | — | 0.80 | — | — | — | 0.80 |
| Melted silica powder GR-80T (Toshiba Ceramics Co., Ltd. made) | 71.0 | 71.0 | 71.0 | 71.0 | 71.0 | 71.0 | 71.0 |
| Epoxy silane coupling agent A-187 (Nihon Unicar Co., Ltd. made) | 0.40 | 0.40 | 0.40 | 0.40 | 0.40 | (0.40 | 0.40 |
| Carbon powder | 0.40 | 0.40 | 0.40 | 0.40 | 0.40 | 0.40 | 0.40 |
| Organic acid content in maleimide resin** | 0.12 | 0.12 | 0.12 | 1.00 | 0.12 | 0.12 | 2.00 |

**Weight % in maleimide resin (Measured after extraction from maleimide resin employing hot water treatment the condition of 95° C. for 20 hours or longer.)

Molding was performed for maleimide resin composition, which had been prepared described above, of Examples 1 to 11 and Comparative Examples 1 to 7 by low pressure transfer molding machine at molding temperature of 180° C. The molded product obtained was checked concerning the following measures of moldability.

Molding time: evaluation of swelling of cull, releasability of a molded product from a mold;

Hardness immediately after molding: measurement using Barcol impresser (#935);

Mold releasing load: load at releasing a molded product from a mold was measured by using a push-pull gage after molding using a mold for measurement of mold releasing load;

Stain of a mold: evaluation by observing of a mold surface after 50 shots of molding of the same composition using the same mold;

Observation of external appearance of a molded product.

The results are showed in Table 3 for Examples 1 to 11 and in Table 4 for Comparative Examples 1 to 7.

It is clear from the results shown in Tables 3 and 4 that the external appearance of the molded product of the maleimide resin composition of the present invention is superior to those of Comparative Examples. The molded product obtained by the resin composition of the present invention shows excellent moldabilitys such as short time for molding and low 0 to 9 kg values of mold releasing load. The maleimide resin compositions of Examples 7 to 11 containing polyethylene waxes as mold release agent shows particularly low mold-releasing load to result in excellent moldability.

Subsequently, at 200° C. for eight hours, test samples were formed by after-curing molded products of maleimide resin compositions of Examples and Comparative Examples. The chips were applied to measurements of the following physical properties.

Gelling time (175° C.)
Glass transition point
Thermal expansion coefficient
High temperature strength (215° C.)
Water absroption (135° C., 85% RH, 20 hours)

The results of these measurements are showed in the following Table 3 and Table 4.

It is clear from Tables 3 and 4 that the physical properties of the molded product of the maleimide resin compositions according to the present invention are superior to those of Comparative Examples.

For the purpose to evaluate performance as encapsulating resin, QFP (Quad Flat Package) having 184 pins was manufactured by encapsulating a test element of chip size 15 mm square with the maleimide resin composition of the present invention and Comparative Examples. The resin encapsulated semiconductor device was applied to after-curing at 200° C. for eight hours, followed by with moisture-absorbing treatment at 85° C. humidity 85% for 168 hours and VPS (vaper phase re-flow treatment at 215° C.) was finally carried out. Crack reaching outside of the encapaulating resin was observed for the resin encapsulated semiconductor device immediately after VPS. Moisture-resistance reliability test was done in a pressure cracker under 121° C. and 2 atms. for the resin encapsulated semiconductor device so as to evaluate occurrence of inferior products.

The results are showed in the following Table 3 and Table 4.

It is clear from the results showed in the Table 3 and 4 that the resin encapsulated semiconductor device manufactured using the maleimide resin composition of the present invention as the encapsulating resin is superior to that manufactured using the maleimide resin composition of Comparative Examples in moisture-resistance characteristic.

From the results of the Comparative Examples 1, 4, and 7, it is suggested that moisture resistance reliability of the resin encapsulated semiconductor device reduces when an organic acid is more contained in the maleimide resin used.

TABLE 3

| | | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Moldability | Molding time (sec) | 120 | 150 | 120 | 150 | 180 | 150 | 120 | 150 | 120 | 150 | 180 |
| | Barcol hardness (#935) | 87 | 86 | 89 | 87 | 85 | 87 | 89 | 87 | 88 | 87 | 86 |
| | Mold releasing | 6 | 8 | 6 | 8 | 9 | 6 | 0 | 0 | 5 | 2 | 5 |

TABLE 3-continued

| | | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| | load (Kg) | | | | | | | | | | | |
| | Stain of mold | c | o | c | o | c | o | o | o | o | o | o |
| | External appearance of molded product | c | c | o | c | o | o | o | o | o | o | o |
| Physical properties | Gelling time at 175° C. (sec) | 22 | 22 | 20 | 21 | 23 | 21 | 20 | 21 | 20 | 22 | 23 |
| | Glass transition point (°C.) | 218 | 218 | 220 | 209 | 209 | 210 | 220 | 210 | 219 | 217 | 208 |
| | Thermal expansion coefficient ($\times 10^5$ deg$^{-1}$) | 1.3 | 1.3 | 1.3 | 1.5 | 1.6 | 1.5 | 1.3 | 1.5 | 1.4 | 1.3 | 1.4 |
| | Bending strength at high temperature [215° C.] (kg/mm$^2$) | 9.2 | 9.1 | 9.2 | 8.0 | 7.9 | 8.5 | 9.2 | 8.5 | 9.5 | 9.0 | 8.2 |
| | Water absorption [135° C., 85% RH, 20h] (ppm) | 5800 | 5500 | 5200 | 3650 | 4100 | 3700 | 5200 | 3700 | 5400 | 5500 | 4806 |
| Moisture-resistance reliability | Moisture absorbance treatment ↓ VPS ↓ Moisture-resistance reliability test | Crack after VPS 100 h 200 h 300 h 400 h 500 h | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 | 0/20 0/20 0/20 0/20 0/20 0/20 |

(the number of detectives/the number of samples)

TABLE 4

| | | Comparative Example | | | | | | |
|---|---|---|---|---|---|---|---|---|
| | | 1 | 2 | 3 | 4 | 5 | 6 | 7 |
| Moldability | Molding time (sec) | 240 | 240 | 240 | 240 | 240 | 240 | 240 |
| | Barcol hardness (#935) | 80 | 77 | 79 | 80 | 85 | 81 | 79 |
| | Mold releasing load (Kg) | 10 | 24 | 30 | 28 | 10 | 20 | 29 |
| | Stain of mold | Δ | x | x | Δ | Δ | x | x |
| | External appearance of molded product | Δ | x | x | Δ | Δ | x | x |
| Physical properties | Gelling time at 175° C. (sec) | 35 | 40 | 36 | 34 | 30 | 35 | 36 |
| | Glass transition point (°C.) | 179 | 190 | 190 | 191 | 180 | 196 | 190 |
| | Thermal expansion coefficient ($\times 10^5$ deg$^{-1}$) | 1.5 | 1.5 | 1.6 | 1.4 | 1.5 | 1.4 | 1.4 |
| | Bending strength at high temperature [215° C.] (kg/mm$^2$) | 6.8 | 6.9 | 7.2 | 7.1 | 7.1 | 7.1 | 7.1 |
| | Water absorption [135° C., 85% RH, 20h] (ppm) | 6100 | 7200 | 6400 | 6300 | 6100 | 7200 | 6300 |
| Moisture-resistance reliability | Moisture absorbance treatment ↓ VPS ↓ θ Moisture-resistance reliability test | Crack after VPS 100 h 200 h 300 h 400 h 500 h | | | | | | |
| | | 3/20 | 8/20 | 4/20 | 5/20 | 2/20 | 6/20 | 5/20 |
| | | 0/20 | 0/20 | 0/20 | 1/20 | 0/20 | 0/20 | 4/20 |
| | | 0/20 | 1/20 | 0/20 | 2/20 | 0/20 | 1/20 | 7/20 |
| | | 0/20 | 2/20 | 0/20 | 5/20 | 0/20 | 2/20 | 15/20 |
| | | 1/20 | 4/20 | 3/20 | 9/20 | 1/20 | 4/20 | 20/20 |
| | | 2/20 | 7/20 | 4/20 | 13/20 | 2/20 | 6/20 | — |

(the number of detectives/the number of samples)

As described in detail above, the maleimide resin composition of the invention has very improved curing characteristics to result in excellent moldability. Thus, according to the invention, when a semiconductor element is encapsulated with the maleimide resin composition, the resin encapsulated semiconductor device can be provided with good external appearance of the molded encapsulating resin mold to result in high reliability. In addition, the maleimide resin composition of the invention is an encapsulating material providing the better characteristics of heat resistance and thermal impulse resistance and meeting the requirement of moisture-resistance reliability and the trend of thinning to a future resin encapsulating semiconductor device to result in bringing great value to industries.

What claimed is:

1. A resin encapsulated semiconductor device comprising:
   A) a semiconductor element; and
   B) a maleimide resin composition encapsulating said semiconductor element,
   wherein said maleimide resin composition comprises:
   i) a maleimide resin;
   ii) a phenolic resin:
   iii) a binary curing catalyst comprising:
      a) a basic catalyst; and
      b) a peroxide catalyst; and
   iv) an inorganic filler,
   wherein the content of organic acid in said maleimide resin contained in said maleimide resin composition is not more than 0.2 weight percent in value as determined by analyzing the organic acid extracted by hot water treatment of said maleimide resin under the condition of 95° C. for at least 20 hours.

2. The resin encapsulated semiconductor device according to claim 1, wherein a polyethylene wax as a mold release agent is added to said maleimide resin composition.

3. The resin encapsulated semiconductor device according to claim 1, wherein said basic catalyst contained in said maleimide resin composition is an organic phosphine.

4. The resin encapsulated semiconductor device according to claim 1, wherein said basic catalyst contained in said maleimide resin composition is an imidazole compound.

5. The resin encapsulated semiconductor device according to claim 1, wherein said basic catalyst contained in said maleimide resin composition is DBU (1,8-di-azabicyclo (5,4,0) undecene-7).

6. The resin encapsulated semiconductor device according to claim 1, wherein said maleimide resin composition is prepared in such a manner that a part or whole of said phenolic resin is preblended with said curing catalyst in advance of other components, and then, the preblend is blended with the other components.

7. The resin encapsulated semiconductor device according to claim 1, wherein said maleimide resin composition is prepared in such a manner that a part of said phenolic resin is preblended with said curing catalyst in advance of other components, while the remainder of the phenolic resin is added to said maleimide resin to prepolymerize, and then, the preblended and the prepolymer are blended with the other components.

8. The resin encapsulated semiconductor device according to claim 1, wherein said organic acid is analyzed by a method selected from the group consisting of ion chromatography and liquid chromatography.

9. The resin encapsulated semiconductor device according to claim 1, wherein said basic catalyst contained in said maleimide resin composition is a phenolic salt of DBU (1,8-di-azabicyclo(5,4,0)undecene-7).

10. The encapsulated semiconductor device according to claim 1, wherein the phenolic resin content of said maleimide resin composition is 10 to 50 wt. % based on that of said maleimide resin.

11. The resin encapsulated semiconductor device of claim 1, wherein the total content of said curing catalyst is 0.1 to 10 wt. % based on that of said maleimide resin and said phenolic resin.

12. The resin encapsulated semiconductor device of claim 1, wherein the content of said peroxide in said curing catalyst is 10 to 50 wt. % based on that of said basic catalyst.

* * * * *